(12) United States Patent
Shashkov et al.

(10) Patent No.: US 9,677,187 B2
(45) Date of Patent: Jun. 13, 2017

(54) NON-METALLIC COATING AND METHOD OF ITS PRODUCTION

(75) Inventors: Pavel Shashkov, Cambridge (GB);
Gennady Khomutov, Moscow (RU);
Aleksey Yerokhin, Sheffield (GB);
Sergey Usov, Cambridge (GB)

(73) Assignees: Cambridge Nanolitic Limited (GB);
Cambridge Nanotherm Limited (GB)

( * ) Notice: Subject to any disclaimer, the term of this patent is extended or adjusted under 35 U.S.C. 154(b) by 980 days.

(21) Appl. No.: 13/984,096

(22) PCT Filed: Feb. 7, 2012

(86) PCT No.: PCT/GB2012/050268
§ 371 (c)(1),
(2), (4) Date: Oct. 18, 2013

(87) PCT Pub. No.: WO2012/107754
PCT Pub. Date: Aug. 16, 2012

(65) Prior Publication Data
US 2016/0186352 A1 Jun. 30, 2016

(30) Foreign Application Priority Data

Feb. 8, 2011 (GB) .................................. 1102174.8
Oct. 3, 2011 (GB) .................................. 1117002.4

(51) Int. Cl.
*C25D 11/02* (2006.01)
*C25D 5/18* (2006.01)
(Continued)

(52) U.S. Cl.
CPC ................ *C25D 5/18* (2013.01); *C25D 11/00* (2013.01); *C25D 11/005* (2013.01); *C25D 11/02* (2013.01);
(Continued)

(58) Field of Classification Search
CPC .................................................. C25D 11/024
See application file for complete search history.

(56) References Cited

U.S. PATENT DOCUMENTS

| 4,936,957 A | 6/1990 | Dickey et al. |
| 5,066,368 A | 11/1991 | Pasqualoni et al. |

(Continued)

FOREIGN PATENT DOCUMENTS

| EA | 012825 | 12/2009 |
| EP | 2371996 | 10/2011 |

(Continued)

OTHER PUBLICATIONS

Official Action with English Translation for Japan Patent Application No. 2013-552278, mailed Jun. 2, 2015, 14 pages.

(Continued)

*Primary Examiner* — James Lin
*Assistant Examiner* — Ho-Sung Chung
(74) *Attorney, Agent, or Firm* — Sheridan Ross P.C.

(57) ABSTRACT

A method of forming a non-metallic coating on a metallic substrate involves the steps of positioning the metallic substrate in an electrolysis chamber and applying a sequence of voltage pulses of alternating polarity to electrically bias the substrate with respect to an electrode. Positive voltage pulses anodically bias the substrate with respect to the electrode and negative voltage pulses cathodically bias the substrate with respect to the electrode. The amplitude of the positive voltage pulses is potentiostatically controlled, whereas the amplitude of the negative voltage pulses is galvanostatically controlled.

35 Claims, 6 Drawing Sheets

(51) Int. Cl.

| | | |
|---|---|---|
| C25D 11/00 | (2006.01) | |
| C25D 11/04 | (2006.01) | |
| C25D 11/26 | (2006.01) | |
| C25D 11/30 | (2006.01) | |
| C25D 11/32 | (2006.01) | |
| C25D 13/02 | (2006.01) | |
| C25D 21/12 | (2006.01) | |
| H01L 23/14 | (2006.01) | |
| H05K 1/05 | (2006.01) | |
| C25D 11/06 | (2006.01) | |
| C25D 15/00 | (2006.01) | |
| H05K 1/02 | (2006.01) | |
| H05K 1/11 | (2006.01) | |
| H05K 1/18 | (2006.01) | |
| H01L 23/373 | (2006.01) | |
| H01L 23/367 | (2006.01) | |

(52) U.S. Cl.
CPC .......... *C25D 11/024* (2013.01); *C25D 11/026* (2013.01); *C25D 11/04* (2013.01); *C25D 11/06* (2013.01); *C25D 11/26* (2013.01); *C25D 11/30* (2013.01); *C25D 11/32* (2013.01); *C25D 13/02* (2013.01); *C25D 15/00* (2013.01); *C25D 21/12* (2013.01); *H01L 23/142* (2013.01); *H01L 23/3735* (2013.01); *H05K 1/021* (2013.01); *H05K 1/053* (2013.01); *H05K 1/115* (2013.01); *H05K 1/18* (2013.01); *H01L 23/3677* (2013.01); *H01L 2224/48227* (2013.01); *H01L 2224/49109* (2013.01); *H01L 2924/01327* (2013.01); *H01L 2924/09701* (2013.01); *H01L 2924/1305* (2013.01); *H01L 2924/13055* (2013.01); *H05K 2201/0116* (2013.01); *H05K 2203/0315* (2013.01); *H05K 2203/1147* (2013.01); *Y10T 428/1317* (2015.01); *Y10T 428/24917* (2015.01); *Y10T 428/249969* (2015.04)

(56) References Cited

U.S. PATENT DOCUMENTS

| | | | |
|---|---|---|---|
| 5,077,595 | A | 12/1991 | Fukunaga |
| 5,486,280 | A | 1/1996 | Bullock et al. |
| 5,687,062 | A | 11/1997 | Larson |
| 5,688,606 | A | 11/1997 | Mahulikar et al. |
| 5,723,038 | A | 3/1998 | Scharnweber et al. |
| 6,248,612 | B1 | 6/2001 | Castro et al. |
| 6,373,705 | B1 | 4/2002 | Koelle et al. |
| 6,887,361 | B1 | 5/2005 | Visco et al. |
| 6,919,012 | B1 | 7/2005 | Bucar |
| 7,036,219 | B2 | 5/2006 | He |
| 7,780,838 | B2 | 8/2010 | Ostrovsky |
| 7,842,545 | B2 | 11/2010 | Lee |
| 8,069,559 | B2 | 12/2011 | Chun |
| 8,804,339 | B2 | 8/2014 | Robert |
| 2008/0257585 | A1 | 10/2008 | Morse |

FOREIGN PATENT DOCUMENTS

| | | |
|---|---|---|
| GB | 2497063 | 10/2013 |
| GB | 2499560 | 1/2014 |
| JP | S55-65396 | 5/1980 |
| JP | H03-13593 | 1/1991 |
| JP | H11-43799 | 2/1999 |
| JP | H11-229187 | 8/1999 |
| JP | 2000-173975 | 6/2000 |
| JP | 2004-142177 | 5/2004 |
| JP | 2006-521473 | 9/2006 |
| JP | 2007-154302 | 6/2007 |
| JP | 2008-527733 | 7/2008 |
| JP | 2008-179901 | 8/2008 |
| JP | 2014-505174 | 2/2014 |
| WO | WO 96/24391 A1 | 8/1996 |
| WO | WO 03/083181 | 10/2003 |
| WO | WO 2008/120046 | 10/2008 |
| WO | WO 2010/073916 | 7/2010 |

OTHER PUBLICATIONS

Information Statement (with English translation of the Notification) for Japanese Patent Application No. 2013-552277, mailed Jun. 30, 2015, 4 pages.

Official Action (with English translation) for Japanese Patent Application No. 2013-552277, mailed Feb. 2, 2016, 12 pages.

Official Action for U.S. Appl. No. 13/984,126, mailed Apr. 12, 2016, 14 pages.

International Search Report and Written Opinion prepared by the European Patent Office on Aug. 1, 2012, for International Application No. PCT/GB2012/050269.

U.S. Appl. No. 13/984,126, filed Aug. 7, 2013, Shashkov et al.

International Preliminary Report on Patentability for International (PCT) Patent Application No. PCT/GB2012/050269 mailed Aug. 22, 2013, 9 pages.

Asquith et al., "Measurement of the Interfacial Shear Strength of a PEO Coated Aluminium Alloy," 17th European Conference on Fracture, Sep. 2008, pp. 2105-2111.

Curran et al., "Mullite-rich plasma electrolytic oxide coatings for thermal barrier applications", Surface & Coatings Technology, 2007, vol. 201, pp. 8683-8687.

Curran et al., "The thermal conductivity of plasma electrolytic oxide coatings on aluminium and magnesium," Surface & Coatings Technology, 2005, vol. 199, pp. 177-183.

Curran et al., "Thermo-physical properties of plasma electrolytic oxide coatings on aluminium," Surface & Coatings Technology, 2005, vol. 199, pp. 168-176.

Keller et al., "Structural Features of Oxide Coatings on Aluminum", Journal of the Electrochemical Society, 1953, vol. 100, Iss. 9, pp. 411-419.

Ogden, "Thermal Conductivity of Hard Anodized Coatings on Aluminum", AIAA/SAE/ASME/ASEE 23rd Jount Propulsion Conference, 1987, 6 pages.

Yerokhin et al., "Plasma electrolysis for surface engineering", Surface and Coatings Technology, 1999, vol. 122, pp. 73-93.

International Preliminary Report on Patentability for International (PCT) Patent Application No. PCT/GB2012/050268 mailed Aug. 22, 2013, 11 pages.

International Search Report prepared by the European Patent Office on Nov. 19, 2012, for International Application No. PCT/GB2012/050268.

Written Opinion prepared by the European Patent Office on Nov. 19, 2012, for International Application No. PCT/GB2012/050268.

Informal Comments dated Mar. 5, 2013, in Response to the Written Opinion for International Application No. PCT/GB2012/050268.

NON-METALLIC COATING AND METHOD OF ITS PRODUCTION

CROSS REFERENCE TO RELATED APPLICATIONS

This application is a national stage application under 35 U.S.C. 371 and claims the benefit of PCT Application No. PCT/GB2012/050268 having an international filing date of 7 Feb. 2012, which designated the United States, and which PCT application claimed the benefit of Great Britain Application No. 1102174.8 filed 8 Feb. 2011, and Great Britain Application No. 1117002.4 filed 3 Oct. 2011, the disclosure of which is incorporated herein by reference.

TECHNICAL FIELD

The invention relates to non-metallic coatings and to methods of forming non-metallic coatings on the surfaces of metallic substrates.

BACKGROUND

Non-metallic coatings in the form of oxide ceramic layers applied on the surfaces of metallic components are widely used in modern engineering applications, typically when the components are required to have a high wear resistance or corrosion resistance. Non-metallic coatings also show significant prospects in emerging high-technology applications.

As an example, alumina-based ceramic surface layers formed on aluminium or aluminium alloy components, provide protection to and enhance the functionality of the components. This is due to the excellent physical and chemical properties of alumina, such as high hardness, high electrical resistivity and chemical stability. Such surface layers are widely used as wear-resistant and corrosion-resistant coatings in mechanical components (especially for moving parts experiencing high contact loads and strains), insulating coatings in electrical and electronic engineering, decorative coatings in construction, and as chemically inert coatings in chemical engineering applications.

Oxide ceramic coatings can be formed on metal substrates by a number of different methods. For example, coatings may be formed by deposition from precursor oxides, by brushing, spraying, or condensation from a vapour or liquid phase. Coatings may also be formed by thermal or electrochemical conversion of a portion of the surface of the metal substrate into an oxide.

Deposition coating techniques allow the use of a wide range of oxide materials but do not always provide good coating adhesion, uniformity and surface finish.

Conversion techniques provide better adhesion, but the range of oxide materials available as a coating is limited by the composition of parent metal.

Thermally activated methods of conversion are unsuitable for treatment of hardened and low-melting-point metal substrates, which are preferentially coated by electrochemical techniques. Relevant electrochemical conversion methods are based on anodic oxidation of the metal surface in aqueous electrolytes and are categorised into conventional low-voltage anodising and high-voltage plasma-assisted processes, such as plasma electrolytic oxidation (PEO). PEO is also known as microarc or microplasmic oxidation or spark anodising. These electrochemical methods can be used for treatment of a wide range of materials, including valve metals (e.g. Mg, Al, Ti, Zr, Nb and Ta) as well as semimetals and semiconductors (e.g. Si, Ge and GaAs).

Anodising is the most common and versatile electrochemical conversion technique, and can be easily scaled up and automated so that up to 100 m² of surface area can be processed simultaneously. The method used to anodise a component generally includes the steps of (i) immersion of the component in a tank containing an electrolytic solution and equipped with a counter electrode; (ii) application of a potential difference between the component and the counter electrode to produce electric current across the electrolyte and (iii) maintaining the potential difference over a period of time to obtain a desirable thickness of the oxide layer.

Both acidic and alkaline electrolytic solutions (electrolytes) are used for anodising, however genuine oxides can be formed only in the former. In alkaline solutions, anodising results in the formation of porous or gel-like hydroxide deposits (as described in U.S. Pat. No. 7,780,838), with poor protective and functional properties. The use of some acid based processes (e.g. chromic acid anodising) is currently limited by the law due to hazardous nature of the components involved.

During anodising, an oxide layer is formed as a result of the following anodic electrochemical processes:

At the oxide-electrolyte interface: $H_2O \leftrightarrow O^{2-} + 2H^+$ (1)

At the metal-oxide interface: $Al \leftrightarrow Al^{3+} + 3e^-$ (2)

Net reaction: $2Al + 3H_2O \leftrightarrow Al_2O_3 + 6H^+ + 6e^-$ (3)

The contribution of oxy-anions to the electrochemical process is negligible, with their incorporation into anodic film structure occurring mainly due to adsorption. Consequently, there is limited scope to control the film chemical composition by varying the oxy-anion content, and any performance enhancement can only be achieved via additional post-anodising treatments. Such treatments include sealing and impregnation for anti-corrosion and tribological performance, colouring and dyeing for optical and aesthetic appearance, and loading with metals for catalytic performance and manufacturing of nano-wires.

Importantly, protons released according to reaction (1) cause local electrolyte acidification in the vicinity of the anode, which increases the risk of oxide dissolution. This risk rises dramatically if the metal substrate is heterogeneous, or if the surface is contaminated. Careful preparation and cleaning of the metal component prior to anodising is therefore essential.

When exposed to an electrolyte having a pH of less than 4, $Al_2O_3$ becomes chemically unstable, even on clean and homogeneous surfaces. This constrains the maximum allowed current density to between 3 and 5 A/dm², which in turn limits the film growth rate and imposes strict requirements on electrolyte composition and temperature control. These issues may be addressed by introduction of electrolyte cooling, rigorous circulation of electrolyte and pauses in anodic polarisation, e.g. by the application of pulsed or AC current modes. Thus, refrigeration down to between 0 and 5° C. is commonly used to produce anodic alumina films with thickness up to between 30 and 50 μm and hardness of between 500 and 600 HV.

U.S. Pat. No. 7,776,198 describes a method for anodizing objects in an electrolyte flow by using current pulses of variable magnitude, whereas I. De Graeve, et al [Electrochim. Acta, 52 (2006) 1127-1134] report on studies of AC anodising of aluminium in solutions of sulphuric and phosphoric acids. Generic disadvantages of these techniques consist in reduced coating growth rate and anodising efficiency compared to DC modes, which is due to the fact that neither pause nor cathodic polarisation contribute to the oxide film formation.

Anodic films have an amorphous physical structure. Films thicker than 1 μm are heterogeneous, featuring thin (0.1 to 0.3 μm) inner barrier layers and a thick porous outer layer comprising ordered honeycomb cells. While these structures may be useful for the production of free-standing ceramic membranes and nanofabrication, the in-plane mechanical properties of anodised surfaces are compromised, which affects their tribological performance as well as the component's bulk strength.

Thus, although scalable and versatile, anodising is environmentally unfriendly technology that requires careful surface preparation and offers a limited protection to the metal components, unless they are subjected to complex post-treatment and finishing procedures. The functional performance of anodic films is also limited due to an inability to control their chemical and phase composition.

Attempts to address major issues associated with anodising resulted in the development of several plasma-assisted electrochemical oxidation processes; these are unified here by the generic term of PEO. Unlike anodising, PEO is carried out in alkaline electrolytes wherein the process at the metal-electrolyte interface does not yield protons:

$$2OH^- \leftrightarrow H_2O+O^{2-} \quad (4)$$

As the local pH cannot drop below 7, there is no risk of oxide chemical dissolution, hence no need for laborious surface preparation and cleaning. Oxide growth is hindered, however, by the formation of aluminium hydroxide:

$$Al^{3+}+3OH^- \rightarrow Al(OH)_3 \quad (5)$$

The overall technological procedure for PEO is similar to that of anodising. One of the main differences is that the applied voltage magnitude is much higher (200 to 800 V). This high applied voltage triggers electrical breakdowns of the growing oxide film. As a result numerous localised micro-discharge events occur on the surface and are manifested in localised flashes of light (also sometimes termed 'microspark discharge', or 'microarcs'). During each individual micro-discharge event, a thin conductive channel is rapidly developed and extinguished, providing a short circuit path for charge and mass transfer across the film. The temperature in the core of this channel is estimated to rise up to between 5 and $20 \times 10^3$ K in a matter of microseconds. This promotes development of localised plasma bulbs where plasma-assisted chemical reactions take place between components of the metal substrate and the electrolyte. Adjacent to discharge surface regions, porous and gel-like hydroxide deposits previously formed according to reaction (5) are dehydrated, sintered and re-crystallised. High-temperature and mixed oxide (e.g. spinel) phases comprising both metal and electrolyte species can be produced in this way as part of a macroscopically dense ceramic surface layer up to 200 to 300 μm thick.

Compounds synthesised by micro-discharge events can exhibit high hardness and dielectric strength (e.g. α-$Al_2O_3$ coatings produced by PEO have a hardness of between 18 and 25 GPa and a dielectric strength of between 20 and 40 kV/mm), good chemical inertness (e.g. alumina, silica) and low thermal conductivity (e.g. PEO alumina coating has been reported to have a thermal conductivity of between 0.8 and 1.7 W/mK [J A Curran and T W Clyne, The thermal conductivity of plasma electrolytic oxide coatings on aluminium and magnesium, Surf. Coat. Technol., 199 (2005) 177-183]). Thus, PEO coatings are attractive for many protective applications.

There are drawbacks to the use of PEO coatings. High thermal gradients associated with discharge events inevitably lead to the generation of internal stresses that can cause cracks in the ceramic layer. These cracks detrimentally affect both wear and corrosion resistance and should be avoided. Also, plasma-chemical reaction products ejected from discharge channels and quenched by the electrolyte tend to form coarse porous structures (the average pore size can be as high as tens of microns) with high surface roughness. The coarse outer layer can make up to 60% of the total coating thickness and must be removed if the component is intended to work in mechanical contact with other surfaces. A dense inner layer starts forming only when the coating thickness exceeds a certain threshold (typically 20 to 30 μm); thinner coatings are rather uneven and offer limited protection.

PEO technology is excessively energy intense, yet laborious and expensive post-treatment finishing is still required. The surface chemistry and phase composition can be controlled within a relatively wide range, however, the coatings are usually produced at a low rate (between 0.5 and 2 μm/min) and develop a course uneven structure with cracks and other defects that compromise their performance.

Both anodising and PEO techniques have limitations. It is an aim of the present invention to provide improved methods of forming a non-metallic coating on a metal or semi-metal substrate. It is a further aim to provide non-metallic coatings with improved properties compared to anodised or PEO generated coatings.

SUMMARY OF THE INVENTION

The invention provides in its various aspects methods of forming a non-metallic coating on a surface of a metallic or semi-metallic substrate, an apparatus for forming a non-metallic coating on the surface of a metallic or semi-metallic substrate, and a non-metallic coating as defined in the appended independent claims to which reference should now be made. Preferred or advantageous features of the invention are set out in various dependent sub-claims.

Thus, in a first aspect the invention may provide a method of forming a non-metallic coating on a surface of a metallic or semi-metallic substrate comprising the steps of positioning the substrate in an electrolytic chamber containing an aqueous electrolyte and an electrode. At least the surface of the substrate on which it is desired to form a coating, and a portion of the electrode are in contact with the aqueous electrolyte. The method comprises the further step of electrically biasing the substrate with respect to the electrode by applying a sequence of voltage pulses of alternating polarity for a predetermined period of time. Positive voltage pulses anodically bias the substrate with respect to the electrode and negative voltage pulses cathodically bias the substrate with respect to the electrode. The amplitude of the positive voltage pulses is potentiostatically controlled, that is controlled with respect to voltage, and the amplitude of the negative voltage pulses is galvanostatically controlled, that is controlled by reference to current.

The terms metallic and semi-metallic as used herein are intended to describe broad classes of material. Thus, these terms describe elemental metals such as pure aluminium or titanium and elemental semi-metals such as silicon, as well as alloys of one or more elements, and intermetallic compounds. Practically, the substrates used in the methods of the invention are likely to be commercially available metallic or semi-metallic compositions.

Many metals may be suitable for use as a substrate on which the non-metallic coating is formed. Suitable materials may include those metals classed as valve metals. The method may be particularly applicable for forming a non-metallic coating on a substrate made from aluminium, magnesium, titanium, zirconium, tantalum, beryllium, or an alloy or intermetallic of any of these metals. The method may also be applicable to the formation of a non-metallic coating on the surface of a substrate made from silicon, germanium, or gallium arsenide.

By applying a sequence of voltage pulses of alternating polarity in which positive pulses are potentiostatically controlled and negative pulses are galvanostatically controlled, it is possible to apply pulses of high voltage to the substrate without inducing substantial levels of micro-discharge. By minimising or avoiding micro-discharge events during the formation of the non-metallic coating, it may be possible to control coating parameters such as the surface roughness and the magnitude of the coating porosity. These parameters in turn control important properties of the coating such as its wear resistance and dielectric strength.

It may be advantageous that the positive and negative voltage pulses are shaped to avoid the development of current spikes during each voltage pulse. Current spikes are associated with the breakdown of the coating and with micro-discharge. By shaping the voltage pulses to avoid current spikes, micro-discharge may be reduced significantly or eliminated. Micro-discharge, as discussed above in relation to prior art PEO coating techniques, has a deleterious effect on a number of coating properties.

It is particularly preferred that both positive and negative voltage pulses comprise an interval during which the voltage is ramped from low voltage to a high voltage, and an interval during which voltage is decreased from a high voltage to a low voltage. It is preferential that each voltage pulse further comprises an interval during which voltage is maintained to be substantially constant.

It may be particularly advantageous if the shape of one or both of the positive and negative voltage pulses is substantially trapezoidal in shape. Thus, a preferred positive voltage pulse for use in the method comprises an interval during which the voltage is increased ($T_{ai}$), an interval during which voltage is maintained to be substantially constant ($T_{ac}$), and an interval during which voltage is decreased ($T_{ad}$). During the period in which voltage is maintained to be substantially constant ($T_{ac}$) the voltage may increase or decrease to a small degree, but is preferably maintained to be within 10% of a maximum or peak voltage. For particularly preferred pulses, the interval $T_{ac}$ is maintained at constant voltage.

Preferably, each negative pulse comprises an interval during which the voltage is increased ($T_{ci}$), an interval during which voltage is maintained to be substantially constant ($T_{cc}$) and an interval during which voltage is decreased ($T_{cd}$).

For each successive positive voltage pulse, the amplitude or peak voltage is preferably maintained at the same value. Thus, for a trapezoidal pulse shape the voltage over the interval $T_{ac}$ is preferably the same voltage for each successive positive voltage pulse over the predetermined period of time.

The conversion of material in the substrate to form a non-metallic coating occurs during the positive voltage pulses in which the substrate is anodically biased with respect to the electrode. The coating is formed as oxygen containing species in the aqueous electrolyte react with the substrate material itself. Over successive positive voltage pulses the non-metallic coating increases in thickness. As the coating increases in thickness the electrical resistance of the coating increases and less current flows for the applied voltage. Thus, while it is preferred that the peak voltage of each of the positive voltage pulses is constant over the predetermined period of time, the current flow with each successive voltage pulse may decrease over the predetermined period of time.

The negative voltage pulses are galvanostatically controlled. This means that the peak applied voltage of each successive negative voltage pulse is determined with reference to the current associated with the voltage pulse.

It is preferred that the current is maintained to be constant for each successive negative voltage pulse over the predetermined period of time. As the coating grows in thickness, and therefore in resistance, higher voltages are required to drive the current. Thus, the amplitude or peak voltage of each successive negative voltage pulse may increase over the predetermined period of time.

Preferably, the amplitude of each of the positive voltage pulses is maintained to be a constant value, and that constant value is preferably between 200 volts and 2000 volts. It may be particularly preferable that the amplitude of each of the positive voltage pulses is maintained at a level between 250 volts and 900 volts, for example about 600 volts or about 650 volts or about 700 volts.

It is also preferred that the amplitude of successive negative voltage pulses increases from an amplitude of about 1 volt or less at the start of the predetermined period of time to a maximum of up to 1000 volts at the end of the predetermined period of time. Particularly preferably, the amplitude of successive negative voltage pulses increases from about 1 volt or less to a maximum of up to 400 volts, or from about 1 volt or less to a maximum of up to 350 volts.

During negative voltage pulses, the electrochemical reaction results in local generation of hydroxyl ions in the vicinity of the substrate:

$$H_2O + e^- \leftrightarrow \tfrac{1}{2}H_2 + OH^- \qquad (6)$$

During subsequent positive voltage pulses, the hydroxyl ions produced are involved in processes of anodic oxygen generation and metal hydroxide formation according to reactions (4) and (5) respectively. This may facilitate metal oxidation and reduce coating porosity. The galvanostatic control over the negative voltage pulses may ensure that $OH^-$ anions are always present in the electrolyte at the oxide-electrolyte interface in sufficient amounts for the oxidation reaction, regardless of their concentration in the bulk of the electrolyte. Thus, efficient metal oxidation may be provided even in diluted alkaline solutions with relatively low conductivity. If there are insufficient amounts of $OH^-$ ions at the oxide-electrolyte interface, micro-discharge may be promoted and the properties of the coating may be deleteriously affected.

As the coating grows in thickness, the resistance of the coating increases and, therefore, the current passing through the coating during each successive negative voltage pulse causes resistive heating of the coating. This resistive heating during negative voltage pulses may contribute to increased levels of diffusion in the coating, and may therefore assist the processes of crystallisation and grain formation within the developing coating. By controlling the formation of the non-metallic coating in this manner, preferably in which micro-discharge is substantially avoided, a dense coating may be formed having crystallites or grain size of extremely fine scale. Preferably, the grain size of the coating formed is less than 200 nanometers, particularly preferably less than 100 nanometers, for example less than 50 nanometers.

The term grain size refers to the distance across the average dimension of a grain or crystal in the coating.

The pulse repetition frequency of the voltage pulses may be between 0.1 and 20 KHz, preferably between 1.5 and 15 KHz, or between 2 and 10 KHz. For example, advantageous pulse repetition frequencies may be 2.5 KHz or 3 KHz or 4 KHz. At low pulse repetition frequencies the coating undergoes long period of growth followed by long periods of ohmic heating. The resulting coating may, therefore, have a more coarse structure or surface profile than if a higher pulse repetition frequency were to be used. Higher pulse repetition frequencies may produce finer structures and smoother coating surfaces, but coating rates and efficiency of the process may decrease.

The extent to which micro-discharge is minimised may be determined by the proportion of each pulse taken up by intervals during which voltage is increased and intervals during which voltage is decreased. For convenience these intervals may be referred to as voltage ramp intervals. Thus, it is preferred that these intervals each comprise between 3% and 30% of the total pulse duration, particularly preferably between 5% and 10% of the total pulse duration. Where voltage ramp intervals take up a low percentage of the total pulse duration, the ramp from zero voltage to peak voltage may occur too sharply. Where the peak voltage is a high level, for instance 1000 volts, it may be difficult to avoid micro-discharge unless the voltage ramp intervals are longer in time. Where the voltage ramp intervals take up greater than 60% percentage of the total pulse duration, the efficiency of the process may be reduced.

The intervals during which voltage is increased or decreased are preferably not shorter than 10 microseconds.

It is preferred, particularly where pulses are trapezoidal in shape, that each voltage pulse comprises an interval during which voltage is maintained at a substantially constant level, and that this interval comprises between 40% and 94% of the total pulse duration.

Preferably, each interval during which voltage is maintained to be constant is within the range of 10 to 9000 microseconds in duration.

It may be advantageous if the method is carried out in an electrolyte that is an alkaline aqueous solution, preferably an electrolyte having a pH of 9 or greater. Preferably, the electrolyte has an electrical conductivity of greater than 1 mS cm$^{-1}$.
Suitable electrolytes include alkaline metal hydroxides, particularly those comprising potassium hydroxide or sodium hydroxide.

It may be particularly advantageous if the electrolyte is colloidal and comprises solid particles dispersed in an aqueous phase. Particularly preferably the electrolyte comprises a proportion of solid particles having a particle size of less than 100 nanometers.

Particle size refers to the length of the largest dimension of the particle.

An electric field generated during the applied voltage pulses causes electrostatically charged solid particles dispersed in the aqueous phase to be transported towards the surface of the substrate on which the non-metallic coating is growing. As the solid particles come into contact with the growing non-metallic coating they may react with, and become incorporated into, the coating.

The coating forming on the substrate is generated during the positive, anodic, voltage pulses. In order for the coating to grow a connection needs to be maintained between the substrate material and the electrolyte. The growing coating is not fully dense, but has a degree of porosity. The connection between the substrate material and the electrolyte is maintained via this porosity. Where the electrolyte is colloidal and comprises solid particles the porosity that is inherent in the formation of the non-metallic coating may be substantially modified. Non-metallic solid particles dispersed in the aqueous phase may migrate under the electric field into pores of the growing oxide layer. Once within the pores the solid particles may react, for example by sintering processes, with both the coating and with other solid particles that have migrated into the pores. In this way the dimensions of the pores are substantially reduced and the porosity of the coating is altered develops as nanoporosity. For example, the maximum dimensions of pores in the coating may be reduced from 1 or more micrometers across to less than 400 nanometers across or less than 300 nanometers across.

By reducing the porosity the density of the coating is increased. Furthermore, the reduction in the dimensions of the porosity through the coating may substantially increase the dielectric strength and thermal conductivity of the coating.

The electrolyte may comprise solid particles that are present from the start of the process, i.e. the particles may be initially present in the electrolyte solution. Alternatively, solid particles may be added to the aqueous electrolyte during the coating process. In this way, the composition and/or structure of the growing coating may be controlled while the coating is growing.

It is preferred that solid particles present in the electrolyte form a stable colloidal solution; i.e. it is preferred that the particles do not coagulate, flocculate, or sediment. The stability of a colloidal electrolyte and the electrophoretic mobility of the particles are determined by the particles' electrostatic charge. According to a theory by Derjaguin, Landau, Verwey, and Overbeek (DVLO) the stability of a colloidal suspension increases with increasing particle charge. The theory treats particle interactions as a superposition of the repulsive electrostatic double layer overlap force and attractive dispersion (van der Weals) force. In the case of aqueous electrolytes, the value of a surface electrostatic charge for a colloidal particle depends on the pH of the liquid phase. The value of the electrostatic charge changes with a change of solution pH. At a certain value of the solution pH, the electrostatic charge of a particle is equal to 0. This is known as the isoelectric point of the solid particle. The pH value corresponding to this isoelectric point is known as the pH of the isoelectric point (pI) of the particle. If the particles' pI is close to the solution's pH, particles tend to coagulate and sediment. They also have a lower electrophoretic mobility due to the lack of electrostatic charge.

It may be advantageous for solid particles in a colloidal electrolyte to have a characteristic isoelectric point and for the pH corresponding to this isoelectric point to differ from the pH of the aqueous phase of the electrolyte by 1.5 or greater.

Where the method of the invention is being carried out in an alkaline electrolyte, it is preferred that the pH is greater than 9, particularly preferably in which the pH is in the range from 10 to 12. Suitable solid particles for forming the colloidal electrolyte may therefore include particles in which the pI is lower than the pH of the electrolyte by more than 1.5, for example particles of alumina (which has a pI of between 7 and 9), silica (pI approximately 3.5), titania (pI approximately in the range 3.9 to 7) and iron oxides (pI approximately 6). Suitable particles may also include those with a pI greater than the pH of the electrolyte by more than 1.5. For example magnesia (pI approximately 12 to 13) and rare earth oxides.

It is preferred that the solid particles are ceramic particles, for example crystalline ceramic particles or glass particles, and that a proportion of the particles have maximum dimensions lower than 100 nanometers. It is particularly preferred that the solid particles are one or more metallic oxides or hydroxides of an element selected from the group comprising silicon, aluminium, titanium, iron, magnesium, tantalum, and the rare earth metals.

Where a colloidal electrolyte is used in a method of forming a non-metallic coating on a substrate, anodic oxidation of the surface of the substrate is complimented by a process of electrophoretic transfer of colloidal particles from the electrolyte. It is preferred that a significant number of the colloidal particles are of a size that is lower than the dimensions of the pores formed in the coating, such that particles from the electrolyte are able to deposit within the pores during growth of the coating. It is thought that a strong electric field is associated with the pores in the coating and, thus, particles from the colloidal electrolyte react strongly with the electric field and are transported to and deposited within the pores.

As has been noted above, one of the beneficial effects of the use of a colloidal electrolyte is that solid particles from the electrolyte are transferred to and incorporated within the growing non-metallic coating, where they may modify the characteristic pore dimensions of the growing coating. It is noted that this beneficial effect is unlikely to occur if a colloidal electrolyte is used in conjunction with a PEO coating process. The micro-discharge events that are characteristic of the PEO process would allow solid particles from within the electrolyte to be fused to and incorporated into the PEO coating structure, but the dimensions and distribution of the porosity in a PEO coating is unlikely to be affected. Due to micro-discharges the pores are likely to remain open and be of a large dimension.

It is further noted that the use of a colloidal electrolyte may be of minimal benefit were the coating to be formed using a standard low-voltage anodising procedure.

Voltages used for standard anodising of metals are much lower than those used for PEO coating, and also much lower than voltages typically used in coating methods according to the present invention. The electric field generated during coating would be weaker, and thus the migration of particles from a colloidal electrolyte would not occur at a fast rate. Furthermore, the temperature of the electrolyte in an anodising process is maintained to be low temperature. Therefore any solid particles from the electrolyte that contact the growing coating will be less likely to interact with, and become incorporated in, the coating.

In a second aspect, the invention may provide a method of forming a non-metallic coating on the surface of a metallic or semi-metallic substrate, comprising the steps of positioning the substrate in an electrolysis chamber containing a colloidal electrolyte comprising solid particles dispersed in an aqueous phase. The chamber also contains an electrode. At least the surface of the substrate and a portion of the electrode are arranged to be contacting the electrolyte. The method comprises the step of electrically biasing the substrate relative to the electrode for a predetermined period of time to generate a non-metallic layer on the surface of the substrate. A series of bipolar electric pulses are applied, such that the polarity of the substrate cycles from being anodic with respect to the electrode to being cathodic with respect to the electrode. The non-metallic layer is formed during periods of the cycle during which the substrate is anodic with respect to the electrode. Solid particles from the colloidal electrolyte have a characteristic isoelectric point, and the pH corresponding to this isoelectric point differs from the pH of the aqueous phase of the electrolyte by 1.5 or greater. During the application of the bipolar electric pulses, the solid particles migrate towards the surface of the substrate under the influence of an applied electric field and are incorporated into the non-metallic layer to form the non-metallic coating.

As described above in relation to preferred features of the first aspect of the invention, it is preferred that the colloidal electrolyte is an alkaline electrolyte, particularly preferably having a pH of greater than 9. It is also preferable that the electrolyte comprises a proportion of solid particles having particle dimensions of less than 100 nanometers. These solid particles are preferably ceramic particles, for example crystalline ceramic particles or glass particles. Of particular advantage are metallic oxides or hydroxides of an element selected from the group comprising silicon, aluminium, titanium, iron, magnesium, tantalum, and the rare earth metals.

With relation to either the method of the first aspect of the invention or the method of the second aspect of the invention described above, the predetermined time during which the process is carried out may be any time required to provide a suitable thickness of coating for an intended purpose. Typically the predetermined time may be between 1 minute and 2 hours. The rate of development of the coating may depend on a number of factors including the waveform used to bias the substrate relative to the electrode, and the density and size of particles in the colloidal electrolyte, where the method employs a colloidal electrolyte. It is particularly preferable that the predetermined time is between 2 minutes and 30 minutes, for example between 3 minutes and 15 minutes.

The temperature of the electrolyte may be controlled. It is envisaged that the temperature of the electrolyte will be maintained within a working range of between about 10° C. and 40° C., for example between 20° C. and 30° C. It may be desirable to operate cooling elements within the electrolytic chamber to maintain the appropriate temperature.

It may be advantageous that the electrolyte is circulated. This may be of particular benefit where the electrolyte is a colloidal electrolyte, in which case circulation may enable particles dispersed within the electrolyte to contact with the surface of the substrate during processing.

For any method disclosed above, the substrate may be in the form of any shape of article or any component having at least a portion of a surface comprising a metal or semi-metal on which a non-metallic coating is desired. The non-metallic coating may be applied to the substrate in order to improve corrosion resistance of the substrate, or to improve wear resistance of the substrate, or to provide specific electrical properties or low friction properties. Advantageously, non-metallic coatings applied to components may not require any further finishing operations.

A wide range of different substrate compositions are envisaged as being suitable for use with the invention, in particular, any material in which a non-metallic surface layer can be preferentially developed when the material is anodically biased in a suitable electrolyte. Advantageously, the substrate may comprise a metal selected from the group consisting of aluminium, magnesium, titanium, zirconium, tantalum, and beryllium. The substrate may also comprise any alloy of these metals, or any intermetallic comprising these metals. Furthermore, the substrate may comprise a semiconductor material. For example, the substrate may comprise the semi-metals selected and germanium or the intermetallic gallium arsenide.

In a third aspect, the invention may provide an apparatus for forming a non-metallic coating on the surface of a metallic or semi-metallic substrate. The apparatus comprises an electrolytic chamber for containing an aqueous electrolyte, an electrode locatable within the electrolysis chamber, and a power supply capable of applying a sequence of voltage pulses of alternative polarity between the substrate and the electrode. The power supply comprises a first pulse generator for generating a potentiostatically controlled sequence of positive voltage pulses for anodically biasing the substrate with respect to the electrode. The power supply further comprises a second pulse generator for generating a galvanostatically controlled sequence of negative voltage pulses to cathodically bias the substrate with respect to the electrode.

The apparatus may comprise a first pulse generator for generating a potentiostatically controlled sequence of positive voltage pulses for anodically biasing the substrate with respect to the electrode, a second pulse generator for generating a galvanostatically controlled sequence of negative voltage pulses to cathodically bias the substrate with respect to the electrode, and a controller for synchronising the output of the first pulse generator and the second pulse generator to produce a desired output waveform. A controller may be implemented in hardware or software, or a combination of hardware and software.

It may be particularly advantageous that the apparatus further comprises a colloidal electrolyte comprising solid particles dispersed in an aqueous phase. As described above, the solid particles dispersed in such an electrolyte may become incorporated into the non-metallic coating generated using the apparatus. The colloidal electrolyte may be any electrolyte as disclosed above in relation to the methods according to the invention.

The non-metallic coatings developed using the methods disclosed above, or using the apparatus disclosed above, produce coatings having unique properties compared with previously known non-metallic coatings, for example coatings produced by the standard anodising processes or by PEO techniques. Thus, in a fourth aspect the invention may further provide an article of manufacture comprising a non-metallic coating formed by any method described above or using the apparatus described above.

In a fifth aspect, the invention may provide a non-metallic coating of between 500 nanometers and 500 micrometers in thickness formed on a metallic or semi-metallic substrate. The coating comprises an oxide of a metal or semi-metal of the substrate. The coating has porosity, and the pores defined in a surface of the non-metallic coating have an average size or average diameter of less than 500 nanometers.

Coatings produced by standard PEO techniques have pores of significantly greater size than 500 nanometers. The nano-scale of the porosity of the coating may contribute to various beneficial mechanical and electrical properties. Preferably, the pores of the non-metallic coating have an average size of less than 400 nanometers, particularly preferably less than 300 nanometers.

In certain applications the dielectric strength of the coating may be of particular importance. The non-metallic coating of this aspect of the invention may, advantageously, have a dielectric strength of between 50 and 120 kV mm$^{-1}$. Preferably the coating has a dielectric strength in the range of 60 to 100 kV mm$^{-1}$.

Certain applications may require that the thermal conductivity of the coating is high. For example, applications exist in which a non-metallic coating is required to provide electrical insulation between a working electronic component or device and a substrate, and simultaneously conduct heat away from this component into the substrate. It may be advantageous, therefore, that the coating has a thermal conductivity of between 4 and 15 W/mK. Particularly preferably the thermal conductivity is between 5 and 14 W/mK.

Many physical properties of coatings are dependent to some extent on the crystallite size or grain size of the coating. Standard anodised coatings are amorphous, i.e. they do not contain or possess a crystal structure. In PEO generated coatings, the high temperatures associated with the micro-discharge events and plasma formation result in crystallisation and grain growth, leaving the coatings with a course and uneven surface and predominantly micron range crystallite size or grain size.

Advantageously, a coating according to the fifth aspect of the present invention may comprise grains or crystallites having an average diameter of less than 200 nanometers, particularly preferably less than 100 nanometers, for example about 50 nanometers or 40 nanometers. Thus, the coating may be described as nano-structured coating or nano-ceramic coating as it has physical features that have a size or dimensions on the nanometer scale. Fine grain sizes may improve structural homogeneity and properties such as hardness, wear resistance, thermal conductivity and electrical breakdown voltage.

PREFERRED EMBODIMENTS OF THE INVENTION

Preferred embodiments of the invention will now be described with reference to the figures, in which.

Figure 1:
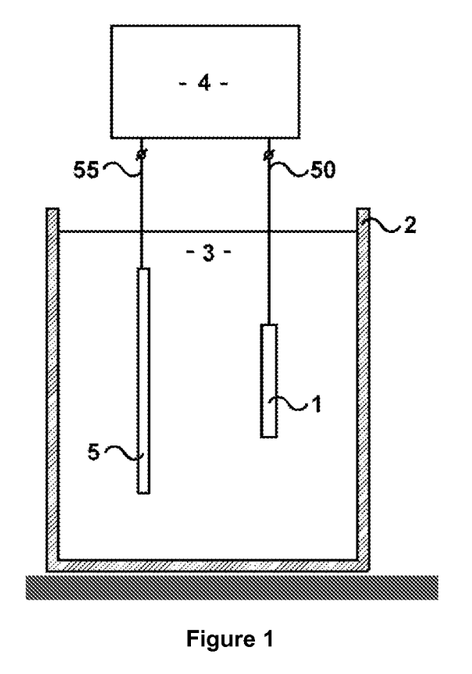
FIG. 1 is a schematic illustration of a first embodiment of an electrolytic apparatus suitable for use with a method of forming a non-metallic coating on the surface of a substrate according to one or more embodiments of the invention.

FIG. 1 illustrates a typical electrolytic apparatus suitable for use with a method of forming a non-metallic coating on a substrate according to one or more embodiments or aspects of the invention. The apparatus comprises a chemically inert tank 2, for example a tank formed from a stainless steel alloy, which contains an electrolyte solution 3. The electrolyte solution 3 is an aqueous alkaline electrolyte solution, for example an aqueous solution of sodium hydroxide or potassium hydroxide, and has an electrical conductivity of greater than 5 mS cm$^{-1}$. The electrolyte may be a colloidal electrolyte comprising solid particles, with a proportion of those particles having a particle size lower than 100 nanometers.

A substrate 1 on which it is desired to form a non-metallic coating is electrically connected to a first output 50 of a pulse power supply 4. An electrode 5 is connected to a second output 55 of the pulse power supply 4, and both the electrode 5 and the substrate 1 are immersed in the electrolyte solution 3 contained within the tank 2. The pulse power supply 4 is capable of supplying electrical pulses of alternating polarity in order to electrically bias the substrate 1 with respect to the electrode 5.

Figure 2:
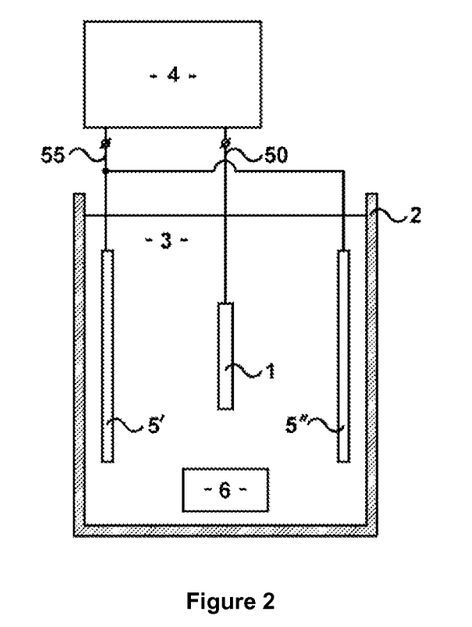
FIG. 2 is a schematic illustration of a second embodiment of an electrolytic apparatus suitable for use with a method of forming a non-metallic coating on a substrate according to one or more embodiments of the invention.

FIG. 2 illustrates an alternative electrolytic apparatus suitable for use with a method of coating a substrate according to one or more aspects or embodiments of the invention. In common with the apparatus described above in relation to FIG. 1, the apparatus of FIG. 2 comprises a chemically inert tank 2 for containing an electrolyte solution 3. A substrate 1 is coupled to a first output 50 of a pulse power supply 4. A second output 55 of the power supply 4 is electrically connected to first and second electrodes 5' and 5", and the substrate 1 and the electrodes 5' and 5" are immersed in the electrolyte 3. The two electrodes 5', 5" are disposed on either side of the substrate 1 in order to generate a more even electric field over the surface of the substrate and produce a more even coating on both sides of the substrate.

It is noted that more than two electrodes may be coupled to an output of the pulse power supply 4 should this be desired. Likewise, more than one substrate may be simultaneously coupled to an output of the pulse power supply 4 so that more than one substrate may be coated at any one time.

The apparatus of FIG. 2 further comprises a heat exchanger 6 through which the electrolyte 3 is circulated. The heat exchanger 6 allows circulation of electrolyte 3 within the tank 2, and furthermore allows control of the temperature of the electrolyte.

A preferred pulse power supply for use with one or more embodiments of the invention is capable of supplying separate positive and negative voltage pulses between the substrate and an electrode. A schematic diagram of a preferred pulse generator is illustrated in FIG. 3.

Figure 3:
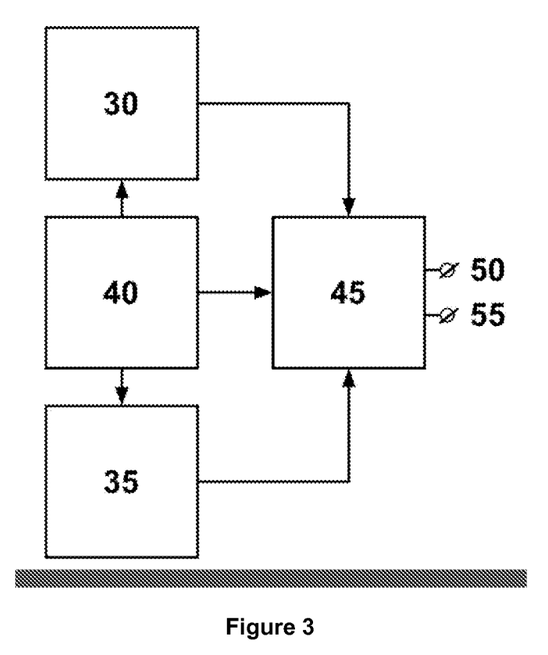
FIG. 3 is a schematic diagram of an electronic power supply suitable for use with the apparatus of FIG. 1 or FIG. 2.

The pulse power supply of FIG. 3 comprises two separate insulated gate bipolar transistor (IGBT) based generators and is a preferred pulse power supply for the apparatus of FIG. 1 or 2. A first generator, or anodic generator, 30 acts a generator of anodic pulses, i.e. pulses that anodically bias the substrate, or substrates, with respect to the electrode, or electrodes. A second generator, or cathodic generator, 35 acts as a generator of cathodic pulses, i.e. pulses that cathodically bias the substrate, or substrates, with respect to the electrode, or electrodes.

The anodic pulse generator 30 and the cathodic pulse generator 35 are independently controlled and synchronised by means of a controller 40. The anodic pulse generator 30 generates trapezoidal-shaped pulses having a fixed voltage amplitude, i.e. the voltage amplitude of the pulses generated by the anodic pulse generator 30 is potentiostatically controlled.

The cathodic pulse generator 35 provides trapezoidal-shaped pulses in which the mean cathodic current is maintained at a fixed value over successive pulses, i.e. the cathodic pulse generator 35 generates pulses that are galvanostatically controlled.

An output switch 45 comprising an H-bridge electronic circuit, couples the anodic pulse generator 30 and the cathodic pulse generator 35 to a first output 50 and a second output 55. During use, the first output 50 is electrically coupled to a substrate and the second output 55 is electrically coupled to one or more electrodes. The controller 40 synchronises the output of the anodic pulse generator 30 and the cathodic pulse generator 35 and allows the output switch 45 to produce an output waveform comprising a sequence of positive and negative trapezoidal-shaped voltage pulses as illustrated in FIG. 4.

Simultaneous use of potentiostatic control for positive (anodic) pulses and galvanostatic control for negative (cathodic) pulses enables a gradual increase in a ratio between the power of cathodic and anodic pulses over the duration of the process, and this creates conditions allowing high energy process without of generation of micro-discharges.

Figure 4:
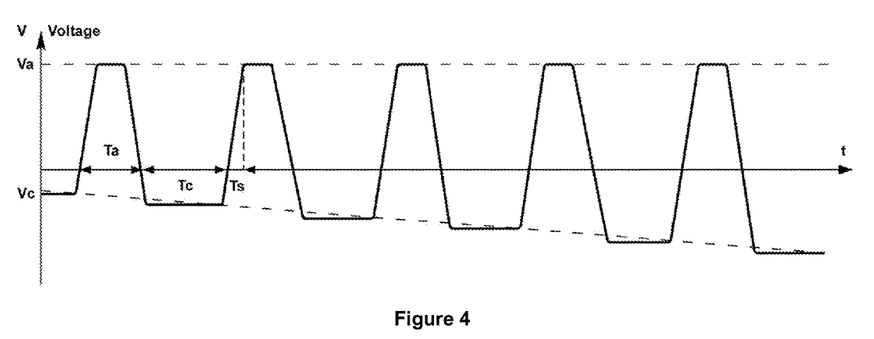
FIG. 4 illustrates a preferred voltage waveform in for use in a method of forming a non-metallic coating on a substrate according to one or more embodiments of the invention.
Figure 5:
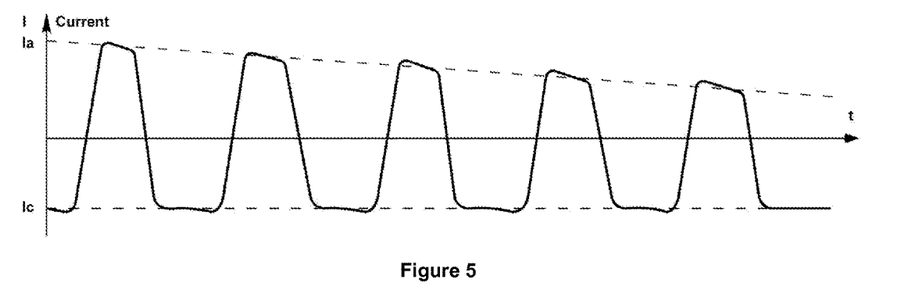
FIG. 5 is a schematic illustration of a current waveform corresponding to the voltage waveform illustrated in FIG. 4.
Figure 6:
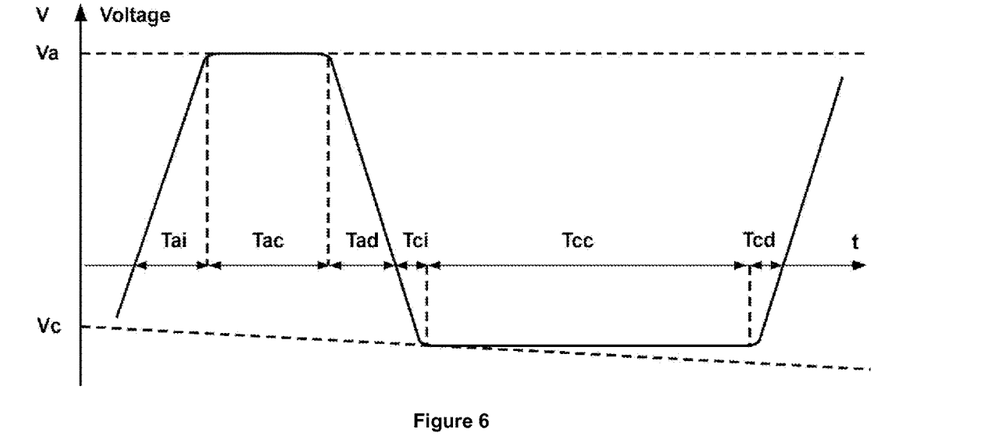
FIG. 6 illustrates details of one positive voltage pulse and one negative voltage pulse from the waveform of FIG. 4, FIGS. 7 and 8 are typical scanning electron micrographs of a non-metallic coating formed on an aluminium alloy according to a specific embodiment of the invention described in Example 1.

A particularly preferred waveform for use in a method of producing a non-metallic coating on a substrate according to one or more embodiments of the invention is illustrated by FIGS. 4, 5 and 6.

FIG. 4 illustrates a waveform consisting of a sequence of alternating positive and negative voltage pulses generated over a period of time. Positive voltage pulses are substantially trapezoidal in shape and have a positive pulse interval ($T_a$) as indicated in FIG. 4. When applied between a substrate and an electrode, positive voltage pulses cause the substrate to be anodically biased relative to the electrode. Successive positive voltage pulses are controlled to have substantially the same voltage amplitude ($V_a$).

Negative voltage pulses are substantially trapezoidal in shape and have a negative pulse interval $T_c$. When applied between a substrate and an electrode, negative voltage pulses cause the substrate to be cathodically biased relative to the electrode. Successive negative voltage pulses are controlled to have substantially the same current amplitude ($I_c$ in FIG. 5).

The amplitude of each successive negative voltage pulse is controlled to be a voltage at which a constant level of current flows across the electrolyte. When used in a method according to an embodiment of the invention the application of the waveform results in a non-metallic coating being formed on the surface of the substrate. As the coating grows thicker its electrical resistance increases and the voltage required to pass the same amount of current increases. Thus, the amplitude of successive cathodic voltage pulses ($V_c$) increases over a period of time.

FIG. 5 is a diagram showing the current waveform that corresponds to the voltage waveform illustrated in FIG. 4. When a positive voltage pulse is applied a positive current is deemed to flow, and when a negative voltage is applied a negative current is deemed to flow. The positive voltage pulses are potentiostatically controlled, such that the amplitude of each successive pulse is substantially the same. Over a period of time the thickness of the coating on the surface of the substrate increases, and the current driven by this voltage decreases. Thus, the positive current pulse amplitude ($I_a$) associated with the positive voltage pulses tend to decrease over the period of time.

As discussed above in relation to FIG. 4, negative voltage pulses are controlled galvanostatically, and thus these pulses are controlled to have a constant current amplitude ($I_c$).

FIG. 6 illustrates a portion of the waveform of FIG. 4 showing one positive voltage pulse and one negative voltage pulse. Each positive voltage pulse is substantially trapezoidal in shape and has an interval ($T_{ai}$) during which the voltage rises from zero to the positive or anodic voltage amplitude ($V_a$). Each positive voltage pulse has an interval ($T_{ac}$) during which constant voltage is applied. This constant voltage is applied at the voltage amplitude of the pulse ($V_a$). Each positive voltage pulse further comprises an interval ($T_{ad}$) during which the voltage decreases from the voltage amplitude ($V_a$) to zero. The intervals ($T_{ai}$) and ($T_{ad}$) may be varied to control the current flow associated with the voltage pulse. It is highly undesirable that current spikes are generated during voltage pulses as current spikes promote the breakdown of the growing coating and cause micro-discharge or plasma generation. Micro-discharge events have a deleterious effect on the quality of the coating produced.

Each negative voltage pulse is substantially trapezoidal in shape and comprises three intervals analogous to the three intervals described in relation to the positive voltage pulses. Each cathodic voltage pulse has an interval ($T_{ci}$) during which voltage is increased from zero to the cathodic voltage amplitude ($V_c$) of that pulse, an interval during which the cathodic voltage remains at the cathodic voltage amplitude ($V_c$) and an interval ($T_{cd}$) during which the voltage decreases from the voltage amplitude ($V_c$) to zero. The voltage amplitude ($V_c$) is determined with respect to the current flow at the voltage. Thus, the voltage amplitude ($V_c$) tends to increase over a period of time, as illustrated in FIG. 4.

The waveforms illustrated in FIGS. 4, 5 and 6 have a number of variables that may be controlled to influence the physical and electrical properties of the coating formed. The duration of both the positive and negative voltage pulses ($T_a$ & $T_c$) may be independently controlled. The intervals ($T_{ai}$, $T_{ac}$, $T_{ad}$, $T_{ci}$, $T_{cc}$ and $T_{cd}$) associated with the positive and negative voltage pulses can be controlled in order to substantially eliminate current pulse sparks and micro-discharge. The amplitude of the positive voltage pulses ($V_a$) may be controlled, as may the current flow at the peak voltage of each of the negative voltage pulses ($I_c$). Furthermore, the frequency of the pulses may be varied within a range of 100 HZ to 20 KHZ.

FIGS. 1 to 6 and the accompanying text describe apparatus and a preferred waveform suitable for generating a non-metallic coating on the surface of a metallic or semi-metallic substrate. Specific embodiments of the invention using apparatus as illustrated in FIG. 1 or 2, including the pulse generator illustrated in FIG. 3 and using the specific waveforms as illustrated in FIGS. 4 to 6, are described in the following examples. In all examples, the colloidal solutions comprise some solid particles with a particle size lower than 100 nanometers.

Example 1

A substrate in the form of a plate of Al 6082 alloy having dimensions of 50 mm×50 mm×1 mm was treated in an apparatus as described above and illustrated in FIG. 1. The apparatus comprised a tank containing an electrolyte, and the substrate and an electrode were coupled to a pulse power supply as described above and illustrated in FIG. 3. The substrate and the electrode were arranged in contact with the electrolyte.

The electrolyte was an aqueous solution containing 1.8 g/l of KOH and 1.0 g/l of Alumina particles, forming a stabilised colloidal solution.

The Pulse Generator applied a sequence of trapezoidally-shaped voltage pulses of alternating polarity between the substrate and the electrode. Positive voltage pulses were applied having a fixed positive voltage amplitude ($V_a$) of 700 V, and negative voltage pulses had a negative voltage amplitude ($V_c$) continuously grown from 0 to 350 V. The pulse repetition frequency was 2.5 KHz.

The pulses were applied for 8 minutes and a non-metallic coating was formed on the surface of the substrate.

Figure 7:
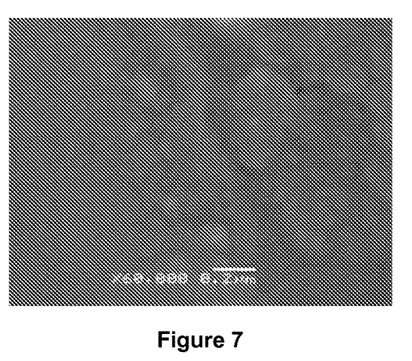
Figure 8:
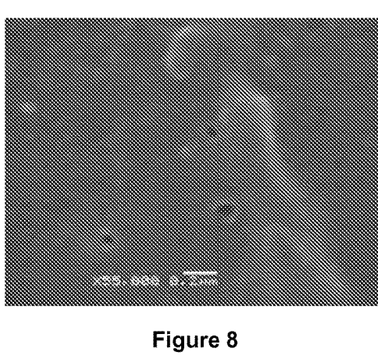

The non-metallic coating was characterised and had the following characteristics: The coating had a smooth surface profile. FIG. 7 illustrates an SEM micrograph showing a portion of the coating at a magnification of 60,000 times. It can be seen that the surface is substantially smooth at this magnification. FIG. 8 is a further SEM micrograph showing a portion of the coating at a magnification of 55,000 times. Pores in the coating having a size of between 50 an 150 nanometers can be seen. Pores of this dimension may be termed nano-pores.

Figure 9:
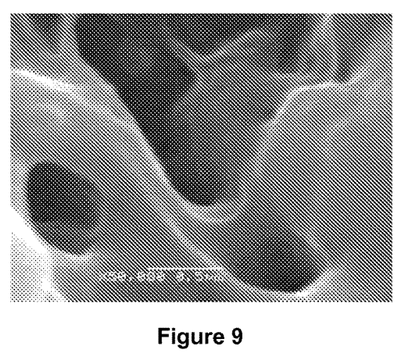
FIGS. 9 and 10 are typical scanning electron micrographs of a non-metallic coating formed on an aluminium alloy by a plasma electrochemical oxidation (PEO) process, showing the significant pore size associated with such a process.
Figure 10:
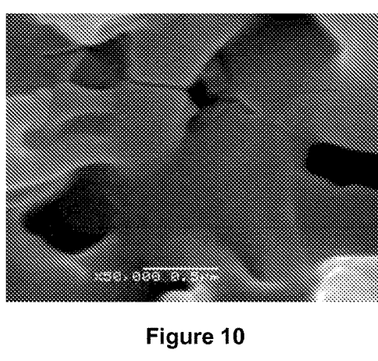

For comparison, FIGS. 9 and 10 show SEM micrographs of a coating formed on the surface of an aluminium alloy by means of a plasma electrochemical oxidation (PEO) process. These micrographs are at a magnification of 50,000 times. The surface of the PEO coating can be seen to be extremely rough at this magnification. Pores formed by plasma bulbs can be seen to have a size of greater than 500 nanometers, in great contrast to the coating illustrated in FIGS. 7 and 8.

Figure 11:
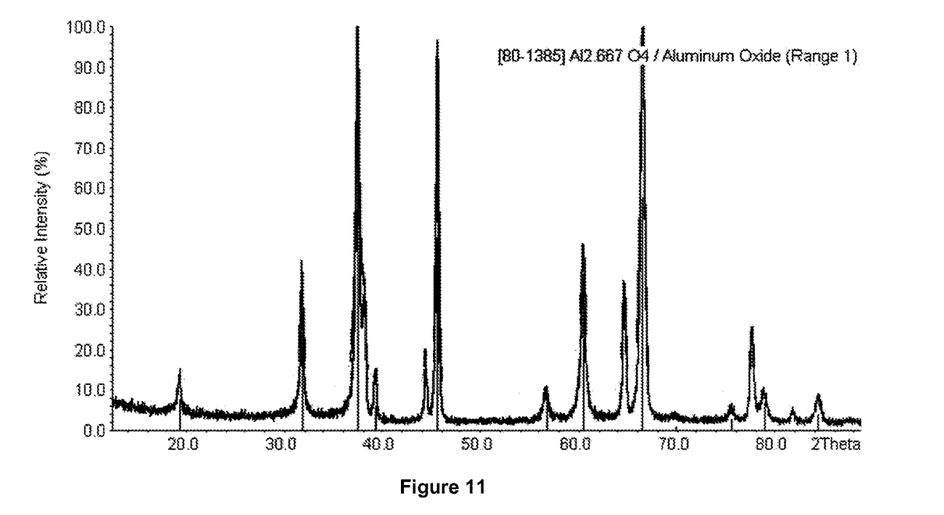
FIG. 11 is an X-ray diffraction (XRD) pattern of a non-metallic coating formed on an aluminium alloy according to a specific embodiment of the invention described in Example 1.

The coating thickness was 20 micrometers and its hardness was measured to be 1550 Hv. An XRD analysis of the coating (FIG. 11, revealed that the composition of the coating was aluminium oxide and that the coating having mean crystalline grain size of 40 nm. The average crystalline size was calculated on the base of the XRD data according to the Scherrer equation (B. D. Cullity & S. R. Stock, *Elements of X-Ray Diffraction*, 3$^{rd}$ Ed., Prentice-Hall Inc., 2001, p 167-171).

The breakdown voltage of the coating was measured to be 1800 V DC and the dielectric strength was measured to be 90 KV/mm.

Example 2

A substrate in the form of a plate of Al 5251 alloy having dimensions 25 mm×25 mm×2 mm was treated using the same apparatus as used for Example 1.

The electrolyte contained 1.5 g/l of KOH and 2 g/l of Titania in stabilised colloidal solution.

The Pulse power supply applied a sequence of trapezoidally-shaped voltage pulses of alternating polarity between the substrate and the electrode. Positive voltage pulses were applied having a fixed positive voltage amplitude ($V_a$) of 600 V, and negative voltage pulses had a negative voltage amplitude ($V_c$) continuously grown from 0 to 300 V. The pulse repetition frequency was 4 KHz.

The pulses were applied for 3 minutes and a non-metallic coating was formed on the surface of the substrate. The coating thickness was 10 micron.

Figure 12:
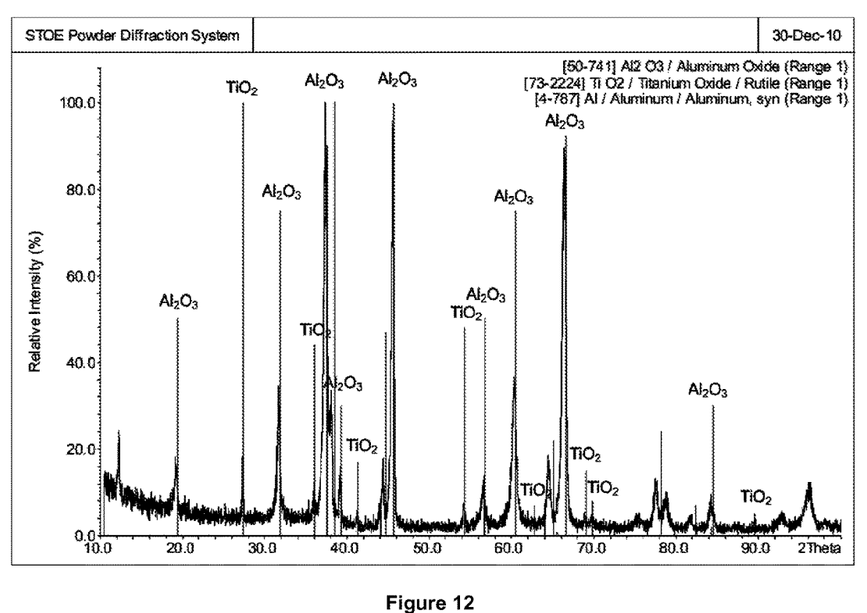
FIG. 12 is an XRD pattern of a non-metallic coating formed on an aluminium alloy according to a specific embodiment of the invention described in Example 2.

FIG. 12 shows an XRD pattern of the produced coating. This pattern shows that the coating has both alumina and characteristic peaks of titania ($TiO_2$) nanoparticles.

TiO$_2$ nanoparticles incorporated in the coating form a material that may efficiently absorb UV radiation. They also reveal catalytic activity in a number of redox processes. TiO$_2$ nanoparticles are used as UV active pigments in paints and protective and self-cleaning coatings including bioactive and bactericidal coatings.

Example 3

A substrate formed from an Al disk made of Al 7075 alloy and having a diameter of 30 mm and thickness of 2 mm was treated in an apparatus as illustrated in FIG. 2.

The electrolyte solution contained 2 g/l of KOH and 3.5 g/l of Sodium Silicate Na$_2$SiO$_3$. The electrolyte temperature was maintained at 20° C. by use of a heat exchanger.

The Pulse Generator applied a sequence of trapezoidally-shaped voltage pulses of alternating polarity between the substrate and the electrode. Positive voltage pulses were applied having a fixed positive voltage amplitude ($V_a$) of 600 V, and negative voltage pulses had a negative voltage amplitude ($V_c$) continuously grown from 0 to 450 V. The pulse repetition frequency was 3 KHz.

The pulses were applied for a period of 18 minutes and the resulting coating had a thickness of 45 micrometers and a hardness of 1750 Hv. Such a coating may be of particular use in applications where a hard protective coating is required.

Example 4

A substrate in the form of a Mg plate specimen made of AZ 91 alloy and having dimensions of 50 mm×50 mm×1 mm was treated in an apparatus as illustrated in FIG. 2.

The electrolyte contained 2.5 g/l of KOH; 5 g/l Na$_4$P$_2$O$_7$; 3 g/l NaF and 5 g/l of Alumina in stabilised colloidal solution.

Electrolyte temperature was maintained at 20° C. by use of heat exchanger.

The Pulse Generator applied a sequence of trapezoidally-shaped voltage pulses of alternating polarity between the substrate and the electrode. Positive voltage pulses were applied having a fixed positive voltage amplitude ($V_a$) of 550 V, and negative voltage pulses had a negative voltage amplitude ($V_c$) continuously grown from 0 to 300 V. The pulse repetition frequency was 1.25 KHz.

The pulses were applied for a period of 4 minutes and the resulting coating had a thickness of 15 micrometers. Such a coating may be of particular use in applications where a protective coating is required.

Example 5

A substrate consisting of a Ti threaded rod specimen made of Ti6Al4V alloy and having a diameter of 5 mm and a length 40 mm was treated in an apparatus as illustrated in FIG. 2.

The electrolyte contained 4.5 g/l of Na$_4$P$_2$O$_7$; 5.5 g/l Na$_2$B$_4$O$_7$; 5.0 g/l NaF and 2 g/l of Titania in stabilised colloidal solution. Electrolyte temperature was maintained at 20° C.

The Pulse Generator applied a sequence of trapezoidally-shaped voltage pulses of alternating polarity between the substrate and the electrode. Positive voltage pulses were applied having a fixed positive voltage amplitude ($V_a$) of 500 V, and negative voltage pulses had a negative voltage amplitude ($V_c$) continuously grown from 0 to 250 V. The pulse repetition frequency was 1 KHz.

The pulses were applied for a period of 3 minutes and the resulting coating had a thickness of 10 micrometers. Such a coating may be of particular use in an anti-galling application.

The invention claimed is:

1. A method of forming a non-metallic coating on a surface of a metallic or semi-metallic substrate comprising the steps of,
   positioning the substrate in an electrolysis chamber containing an aqueous electrolyte, the aqueous electrolyte being an alkaline solution, and an electrode, at least the surface of the substrate and a portion of the electrode contacting the aqueous electrolyte, and
   electrically biasing the substrate with respect to the electrode by applying a sequence of voltage pulses of alternating polarity for a predetermined period of time, positive voltage pulses anodically biasing the substrate with respect to the electrode and negative voltage pulses cathodically biasing the substrate with respect to the electrode,
   in which the voltage pulses have a pulse repetition frequency of between 0.1 and 20 KHz, and in which the amplitude of the positive voltage pulses is potentiostatically controlled, and the amplitude of the negative voltage pulses is galvanostatically controlled,
   in which the amplitude of each of the positive voltage pulses is constant over the predetermined period of time, and in which the amplitude of successive negative voltage pulses increases over the predetermined period of time.

2. A method according to claim 1 in which both the positive and negative voltage pulses are substantially trapezoidal in shape.

3. A method according to claim 1 in which the amplitude of each of the positive voltage pulses is between 200 volts and 2000 volts.

4. A method according to claim 1 in which the amplitude of each of the positive voltage pulses is between 250 volts and 900 volts.

5. A method according to claim 1 in which the amplitude of each of the positive voltage pulses is about 600 volts or about 650 volts or about 700 volts.

6. A method according to claim 1 in which the amplitude of successive negative pulses increases from about 1 volt to a maximum of up to 1000 volts over the predetermined period of time.

7. A method according to claim 1 in which the amplitude of successive negative pulses increases from about 1 volt to a maximum of up to 400 volts.

8. A method according to claim 1 in which the voltage pulses have a pulse repetition frequency of between 1.5 and 15 KHz.

9. A method according to claim 1 in which the voltage pulses have a pulse repetition frequency of between 2 and 10 KHz.

10. A method according to claim 1 in which each positive voltage pulse comprises an interval during which the voltage is increased ($T_{ai}$) and an interval during which voltage is decreased ($T_{ad}$) and/or each negative voltage pulse comprises an interval during which the voltage is increased ($T_{ci}$) and an interval during which voltage is decreased ($T_{cd}$), wherein each of the intervals during which voltage is increased or decreased comprises between 3% and 30% of the total pulse duration.

11. A method according to claim 10 in which each positive voltage pulse further comprises an interval ($T_{ac}$) during which voltage is maintained to be substantially constant and/or each negative voltage pulse further comprises an interval ($T_{cc}$), during which voltage is maintained to be substantially constant.

12. A method according to claim 11 in which the, or each, interval during which voltage is maintained to be constant comprises between 40% and 94% of the total pulse duration.

13. A method according to claim 10 in which the, or each, interval during which voltage is increased or decreased is not shorter than 10 microseconds.

14. A method according to claim 11 in which the, or each, interval during which voltage is maintained to be constant is within the range of 10 to 9000 microseconds in duration.

15. A method according to claim 1 in which the electrolyte has a pH of 9 or greater.

16. A method according to claim 15 in which the electrolyte has an electrical conductivity of greater than 1 mS cm$^{-1}$.

17. A method according to claim 1 in which the electrolyte comprises an alkaline metal hydroxide.

18. A method according to claim 1 in which the electrolyte comprises potassium hydroxide or sodium hydroxide.

19. A method according to claim 1 in which the electrolyte is colloidal and comprises solid particles dispersed in an aqueous phase.

20. A method according to claim 19 in which the electrolyte comprises a proportion of solid particles having particle dimensions of less than 100 nanometers.

21. A method according to claim 19 in which the solid particles have a characteristic isoelectric point and the pH of this isoelectric point differs from the pH of the electrolyte by 1.5 or greater.

22. A method according to claim 19 in which the solid particles are ceramic particles.

23. A method according to claim 19 in which the solid particles are metallic oxides or hydroxides.

24. A method according to claim 23 in which the solid particles are oxides or hydroxides of an element selected from the group comprising silicon, aluminium, titanium, iron, magnesium, tantalum and the rare earth metals.

25. A method according to claim 19 comprising a step of incorporating solid particles from the electrolyte into the non-metallic coating.

26. A method according to claim 1 in which localised plasma micro-discharge is not generated during formation of the non-metallic coating.

27. A method according to claim 1 in which the predetermined period of time is between 1 minute and 2 hours.

28. A method according to claim 1 in which the predetermined period of time is between 2 minutes and 30 minutes.

29. A method according to claim 1 comprising the further step of maintaining the electrolyte at a temperature of between 10 and 40 degrees Centigrade.

30. A method according to claim 1 further comprising the step of circulating the electrolyte.

31. A method according to claim 1 in which the substrate comprises a metal selected from the group consisting of aluminium, magnesium, titanium, zirconium, tantalum, beryllium, or an alloy or intermetallic of any of these metals.

32. A method according to claim 1 in which the substrate is a semiconductor, for example silicon, germanium or gallium arsenide.

33. An apparatus for forming a non-metallic coating on the surface of a metallic or semi-metallic substrate comprising, an electrolytic chamber for containing an aqueous alkaline electrolyte, an electrode locatable within the electrolytic chamber, and a power supply capable of applying a sequence of voltage pulses of alternating polarity between the substrate and the electrode, the voltage pulses have a pulse repetition frequency of between 0.1 and 20 kHz, the power supply comprising a first pulse generator for generating a potentiostatically controlled sequence of positive voltage pulses to anodically bias the substrate with respect to the electrode and a second pulse generator for generating a galvanostatically controlled sequence of negative voltage pulses to cathodically bias the substrate with respect to the electrode.

34. An apparatus according to claim 33 further comprising a colloidal electrolyte comprising solid particles dispersed in an aqueous phase.

35. An article of manufacture comprising a non-metallic coating formed by a method according to claim 1.

* * * * *